United States Patent [19]

Wertheimer

[11] Patent Number: 4,728,863

[45] Date of Patent: Mar. 1, 1988

[54] APPARATUS AND METHOD FOR PLASMA TREATMENT OF SUBSTRATES

[76] Inventor: Michael R. Wertheimer, 91 Somerville Avenue, Westmount, Quebec, Canada, H3Z 1J4

[21] Appl. No.: 804,536

[22] Filed: Dec. 4, 1985

[51] Int. Cl.$^4$ .......................... H01J 7/24; H05B 31/26
[52] U.S. Cl. ................................. 315/111.21; 315/39; 315/111.51; 118/729; 118/50.1; 422/186.05
[58] Field of Search ........................ 315/111.21–111.91, 315/39; 118/113, 729, 730, 731, 50.01; 422/186.05

[56] References Cited

U.S. PATENT DOCUMENTS

| | | |
|---|---|---|
| 3,814,983 | 6/1974 | Weissfloch et al. ............ 315/111.21 |
| 3,911,318 | 10/1975 | Spero et al. .................... 422/186.05 |
| 4,521,717 | 6/1985 | Kieser ............................. 315/111.41 |
| 4,548,699 | 10/1985 | Hutchinson et al. ............... 118/729 |
| 4,583,488 | 4/1986 | Brown, Jr. et al. ................ 118/729 |
| 4,630,563 | 12/1986 | Kieser ................................. 118/729 |
| 4,630,566 | 12/1986 | Asmussen et al. ............. 315/111.41 |

Primary Examiner—Saxfield Chatmon
Attorney, Agent, or Firm—Chilton, Alix & Van Kirk

[57] ABSTRACT

An apparatus for substantially uniformly treating a substrate with a microwave plasma consists of a mechanism for simultaneously moving the substrate in two directions relative to the direction of plasma production. In one embodiment, the substrate is simultaneously moved rotationally and translationally. In a second embodiment, the substrate is subjected to planetary motion.

30 Claims, 6 Drawing Figures

APPARATUS AND METHOD FOR PLASMA TREATMENT OF SUBSTRATES

BACKGROUND OF INVENTION

1. Field of the Invention

The invention relates to a process for treating one or more substrates with a plasma, as well as to an apparatus for carrying out the process. More specifically, the invention relates to such a process and apparatus wherein the substrates are substantially uniformly treated by the plasma.

2. Description of Prior Art

Cold (thermodynamically non-equilibrium) plasmas, excited by a high frequency electromagnetic field in a gas or vapor maintained at a low pressure (partial vacuum) are being used in various industrial processes for treating a variety of substrate surfaces. A major user of cold plasmas is the electronic components industry. In this industry, plasmas are used for a variety of processes involving deposition of thin film materials (referred to as plasma-assisted chemical vapor deposition, PACVD). Plasmas are also used in this industry for the selective removal of material by plasma-generated active chemical species. The latter process is generically known as "plasma etching" or "dry etching".

Many plasma reactor systems for carrying out treatments such as deposition and etching operations can be found in the patent and technical literature. Most of these operate in a regime in which the frequency of the applied electromagnetic field, $\omega$, lies in the range extending from audio frequencies, typically kHz to tens of kHz, to radio frequencies, i.e., up to about 27.12 MHz.

A particularly favourable frequency range at which to conduct plasma treatments such as deposition and etching operations is the microwave range ($\omega > 300$ MHz), for example, at the ISM frequency of 2.45 GHz. The reason that this range is favourable, as explained in an article by Michael R. Wertheimer and Michel Moisan, J. Vac. Sci. Technol. November 1985, is that the concentration of plasma-generated active species is much higher in this frequency range than at lower frequencies. This allows one to conduct a given plasma treatment (for example, deposition or etching operation) much more rapidly—a distinct advantage for most industrial processes.

A method and apparatus which can be used for plasma treating a substrate is taught in U.S. Pat. No. 3,814,983, June 4, 1974, Weissfloch et al. In this apparatus, a slow wave structure is used for applying microwave energy to partially ionize a gas in order thereby to provide a plasma. A problem with this apparatus and method is that, as the microwave power density at the input end of the slow wave structure tends to be greater than the microwave power density at the output end thereof, treatment (for example, coating or etching) of the substrate will not be uniform along the length of the slow wave structure. One approach to overcoming this problem is taught in U.S. Pat. No. 4,521,717, June 4, 1985, Kieser. In this approach, two slow wave structures are used each arranged at opposite acute setting angles to the surface of the substrate carrier. It is noted that this approach is also suggested in the '983 patent.

With this approach, it is necessary to use at least two slow wave structures.

The present application teaches a different approach for solving the same problem, which has the advantage of using a single slow wave structure.

SUMMARY OF INVENTION

It is an object of the invention to provide a process and apparatus as above-described wherein the substrate will be substantially uniformly treated by the plasma.

In accordance with the invention, the substrate is simultaneously moved in two directions relative to the length of the slow wave structure, hereafter referred to as the direction of plasma production, whereby to attain the objective of substantially uniformly treating said substrate with said plasma.

In one embodiment, the substrate is rotationally and translationally moved relative to the direction of plasma production.

In a second embodiment, the substrate is moved in a planetary motion relative to the direction of plasma production.

BRIEF DESCRIPTION OF DRAWINGS

The invention will be better understood by an examination of the following description, together with the accompanying drawings, in which.

DESCRIPTION OF PREFERRED EMBODIMENTS

Figure 1:
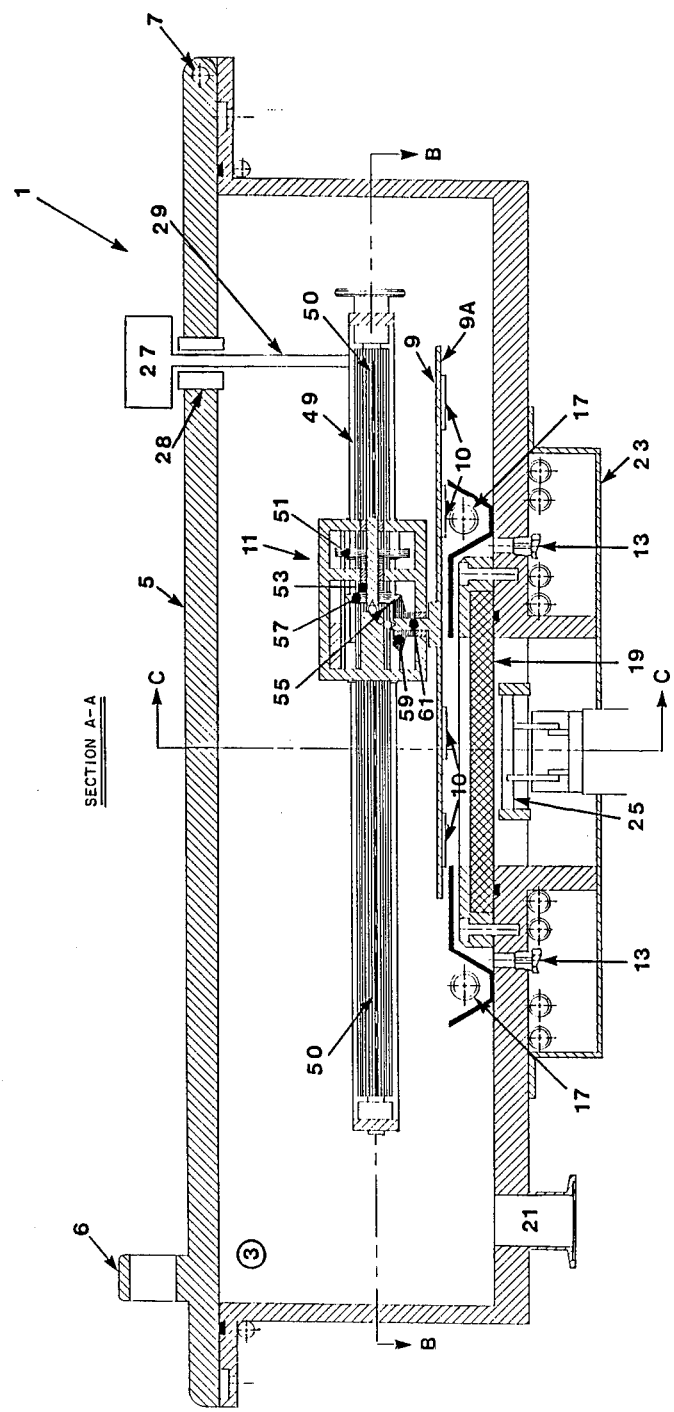
FIG. 1 is a section through A—A of FIG. 2 and is basically a top view of one embodiment of an apparatus in accordance with the invention.

Referring now to the drawings, the apparatus, illustrated generally at 1, comprises a vacuum or reaction chamber 3 having a rear door 5 which can be opened by a door handle 6. The door is pivotable about hinges 7 for opening and closing.

Figure 3:
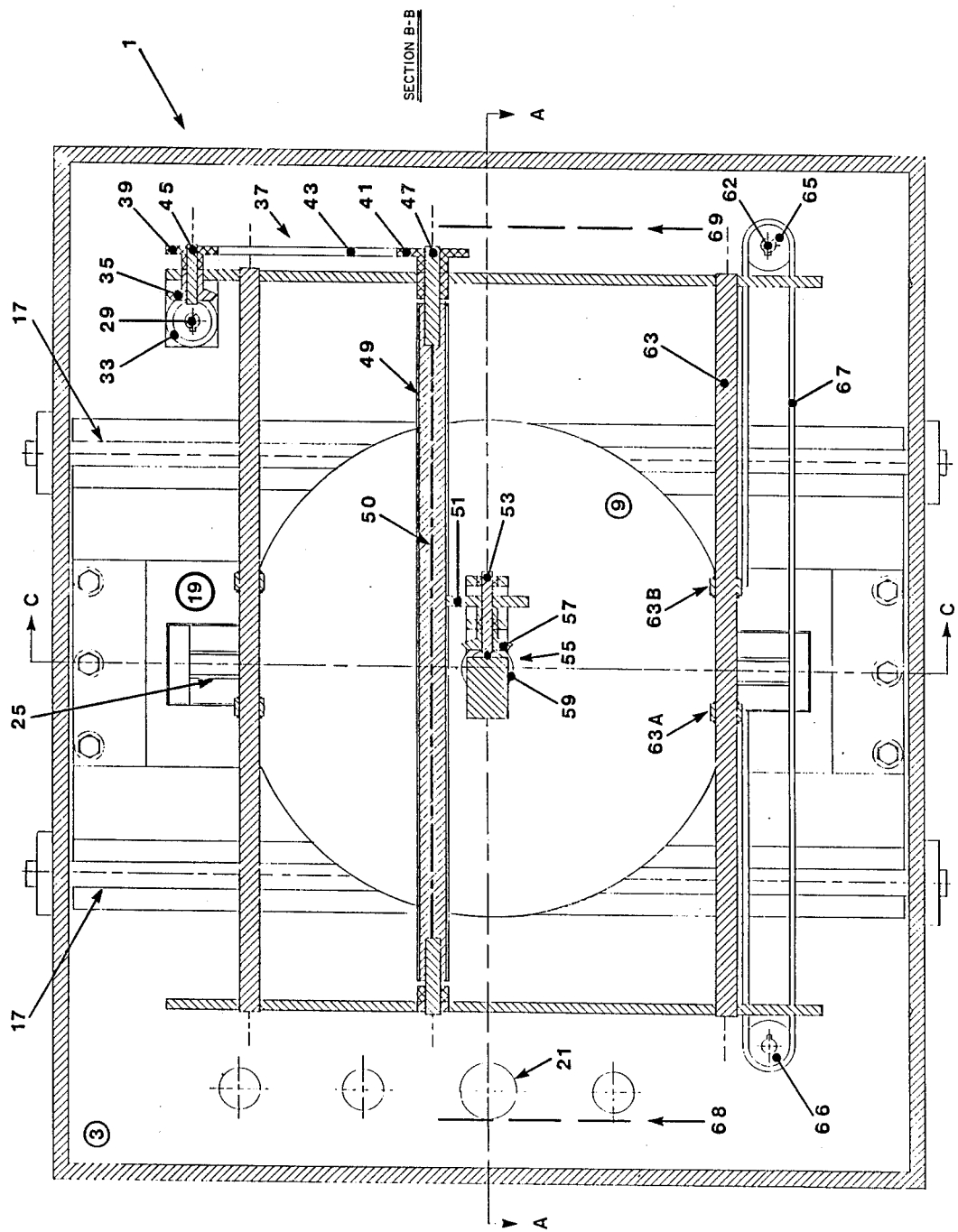
FIG. 3 is a section through B—B of FIG. 1 and is basically a rear view of the apparatus of the first embodiment.

Disposed in the reaction chamber is a substrate carrier 9 which, as seen in FIG. 3, is disk-shaped. An arrangement 11, which will be further described below, provides simultaneous motion in two directions, i.e., both rotational and translational motion, to the substrate carrier 9.

The reaction chamber also includes gas inlets 13 as well as heaters 17. The front of the reaction chamber is closed by a microwave window 19, that is, a window made of a material which is vacuum-tight but which is transparent to microwave radiation. The window can comprise silica glass or it may comprise such other materials as discussed in the '983 patent above referenced.

The vacuum in the reaction chamber is created by a vacuum pump (not shown) via vacuum port 21 so that the process in the reaction chamber can be carried out at low pressure, i.e. at a partial vacuum, whereby fresh reagent gas or vapor is continuously introduced through inlets 13, and gaseous reaction products are continuously evacuated through port 21.

Figure 2:
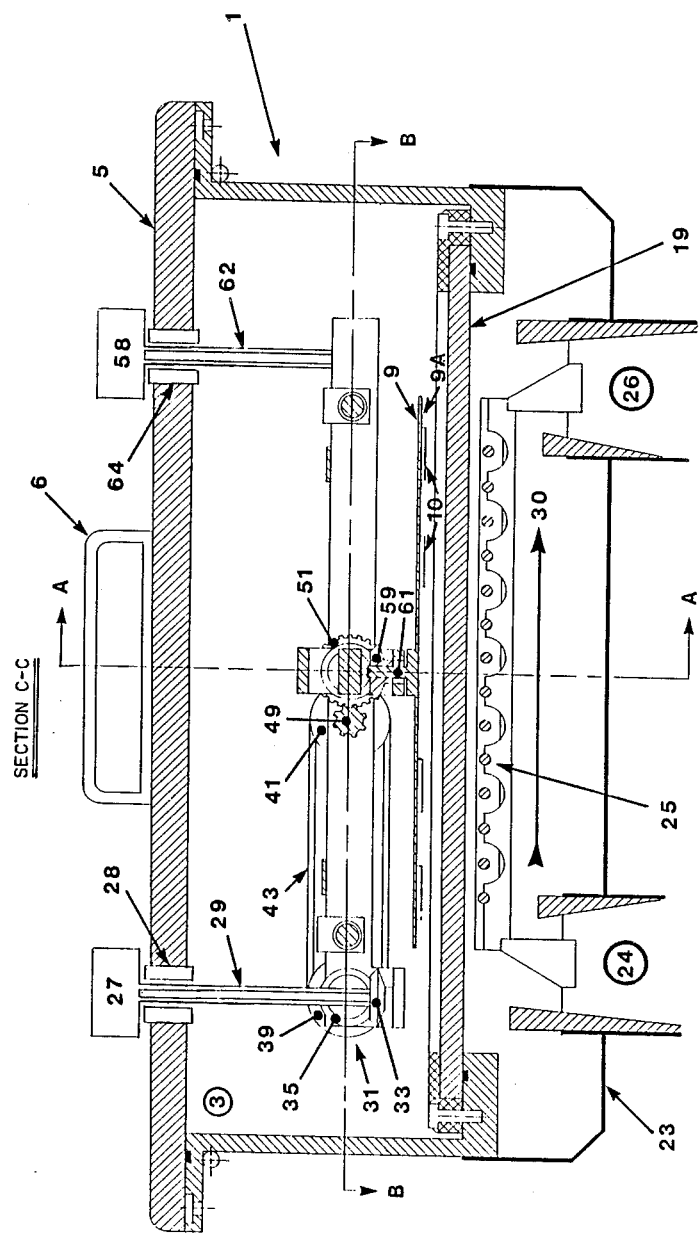
FIG. 2 is a section through C—C of FIG. 1 and is basically a side view of the apparatus of the first embodiment.

Outside of the reaction chamber, and at the front thereof, behind the window 19, is an enclosure 23 which carries a means for applying microwave energy 25 (see also FIG. 2). The means for applying such microwave energy is preferably a slow wave structure of the type as illustrated in the '983 patent above-referenced.

Referring to FIG. 2, the microwave slow wave structure 25 has an input end 24 and an output end 26 so that it will propagate a slow wave of electromagnetic energy at microwave frequencies along the direction 30.

As seen in FIG. 1, the substrates 10 to be treated by the microwave plasma, in this illustration comprising a plurality of discrete components, are carried on the side 9A of the substrate carrier 9, i.e. the side facing the microwave window. The substrates may be circular or any other shape, or the substrate may be a single component having a large surface area.

Turning now to the means for imparting rotational motion to the substrate carrier, this means comprises a first motor 27 attached to the outside of the door 5. The output shaft 29 of motor 27 extends through a first rotating vacuum seal 28, and it is connected to a first bevel gear arrangement 31 (FIG. 2) having an input gear 33 and an output gear 35. As is well known, rotation of the shaft 29 by the motor 27 will impart rotary motion to the input gear 33 which, as it is in mating engagement with the output gear 35, will impart rotary motion to the output gear 35. The motion of the gear 35 is at an angle of 90° to the motion of the gear 33.

The output gear 35 is connected to a chain drive mechanism 37 (FIG. 3) which includes a drive sprocket wheel 39, an output sprocket wheel 41, and a chain 43. Output gear 35 is connected to the drive sprocket wheel 39 by way of shaft 45, and output sprocket wheel 41 is connected to shaft 47.

Shaft 47 is, in turn, connected as an input to an elongated gear 49 which can rotate about an axis 50. A perpendicular mating gear 51 engages with the elongated gear 49 (FIGS. 1 and 3). The gear 51 is connected to a second bevel gear arrangement 55 by shaft 53. The second bevel gear arrangement 55 comprises an input gear 57 and an output gear 59. The output gear 59 being, once again, at right angles to the input gear 57. The output gear 59 is connected to shaft 61 (FIG. 1) which is the drive shaft capable of imparting rotational motion to the substrate carrier 9.

Translational motion is provided by a second motor 58 (FIG. 2) attached to the outside of door 5. The output shaft 62 of motor 58 extends through a second rotating vacuum seal 64 to a second chain drive mechanism comprising a drive sprocket wheel 65, a second sprocket wheel 66, and a chain 67 (FIG. 3). A mobile carriage 63 onto which is mounted the substrate carrier 9, and the mechanisms providing rotational motion of said substrate holder, namely gear 51 and the second bevel gear arrangement 55 described above, can be moved in a direction parallel to the axis 50 of the elongated gear 49, by virtue of being mechanically attached to the extremities of chain 67 by attachments 63A and 63B. More specifically, the outer perimeter of the substrate carrier 9 can be made to move between two extreme positions, designated 68 and 69, respectively, in FIG. 3. This is accomplished by displacing the carriage 63 by means of the second chain drive assembly described above. Rotational motion is transmitted by motor 58 to shaft 62 which drives the chain 67 and attached carriage 63, first in one direction until position 68 is reached, at which time the direction of motion is reversed and maintained until the opposite extreme position 69 is reached, upon which reversal again occurs and the process is repeated. During the entire back-and-forth translational motion, gears 49 and 51 mesh as described above, providing to substrate carrier 9 rotational motion at a constant angular velocity. Said angular motion is always in the same direction, and is independent of the location of the carriage and substrate carrier between positions 68 and 69.

It can thus be seen that rotational and translational motion is imparted to the substrate carrier, the rotational motion about an axis perpendicular to the direction 30, and both rotational and translational motion in a plane substantially parallel to the direction 30. The translational motion is perpendicular to the direction 30.

When the apparatus is in operation, gas to be ionized is introduced to the gas inlets 13. As seen in FIG. 3, the microwave window 19 extends along the height of the front wall and is essentially parallel to the microwave slow wave structure 25. More specifically, the slow wave structure makes an acute angle $\theta$ (typically a few degrees, for example 6°) with the planes of the microwave window 19 and the substrate carrier 9, as taught in the '983 patent above-referenced, the input end 24 being somewhat further from window 19 than the output end 26. Microwave energy is provided to the microwave slow wave structure 25 so that a plasma will be produced inside reaction chamber 3, on the inside of window 19, along the direction 30 of FIG. 2. As described in the above-cited references, the intensity of plasma adjacent the input end 24 will generally be somewhat greater than the intensity of plasma adjacent the output end 26 so that, potentially, the plasma will treat the substrate or substrates 10, which is or are carried on the front surface 9A of the substrate carrier, unevenly.

In order to overcome this undesirable situation, the substrate carrier 9 is subjected to the combination of rotational and translational motions, achieved by the mechanical means described above. The result is that all parts of the front surface 9A, and therefore one or more substrates 10 attached thereto, are subjected to substantially uniform exposure to the plasma averaged over time, and that the cumulative effect of the plasma will be substantially uniform treatment of any given location on the front surface 9A of the substrate carrier 9. For certain types of processes it is desirable to heat the substrate surface to an elevated temperature during plasma treatment. When this is the case, the two radiant heaters 17, disposed symmetrically on both sides of the microwave window 19, assure uniform radiant heating of the substrate carrier 9, while said substrate carrier is made to move back-and-forth in front of said radiant heaters. Another way of accomplishing said heating of said substrate surface is to incorporate a heating element or heating elements directly into the substrate carrier 9. Said heating means can be provided with electrical current during rotation of substrate carrier 9 via a slip-ring arrangement, well known to those skilled in the art. In further providing temperature control, cooling means may also be provided to rapidly return the substrate carrier to ambient in preparation for the next batch.

Figure 4:
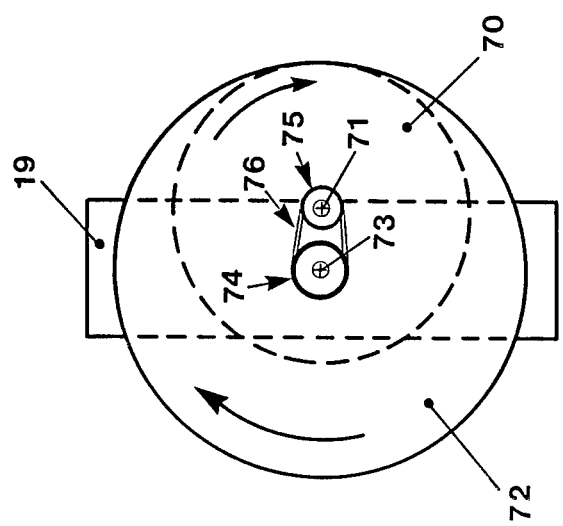
FIG. 4 is a rear view of a mechanism in schematic form for producing motion in two directions via a planetary motion.

Turning now to FIG. 4, an alternate means for achieving motion in two directions for the purpose of imparting substantially uniform treatment to a substrate or substrates by the plasma, is provided by a planetary motion mechanism, said mechanism providing a combination of two rotational motions. The substrate carrier comprises a disc 70 which is rotated about an axle 71. The axle 71 is mounted on a second carrier comprising a disc 72 which is itself rotated about an axle 73. Thus, with the planetary arrangement, the motion in two directions consists of rotary motion about the axle 71 and simultaneous rotary motion about the axle 73.

Figure 5:
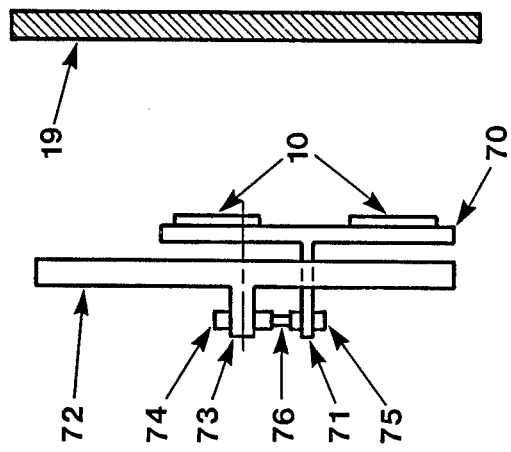
FIG. 5 is a side view of FIG. 4.

As seen in FIG. 5, the substrates 10 are on the side of the substrate carrier 70 which faces the microwave window 19. As also seen in FIGS. 4 and 5, one mechanism for providing the two rotary motions consists of a chain drive arrangement comprising a first sprocket wheel 74, mounted on the axle 73, and a second sprocket wheel 75, mounted on the axle 71. The sprocket wheels are joined by a chain 76. Either axle 71 or 73 would be connected to a motor shaft for rotation thereby, and the rotation of the axle rotated by the motor would be transmitted to the other axle by the chain drive system.

Figure 6:
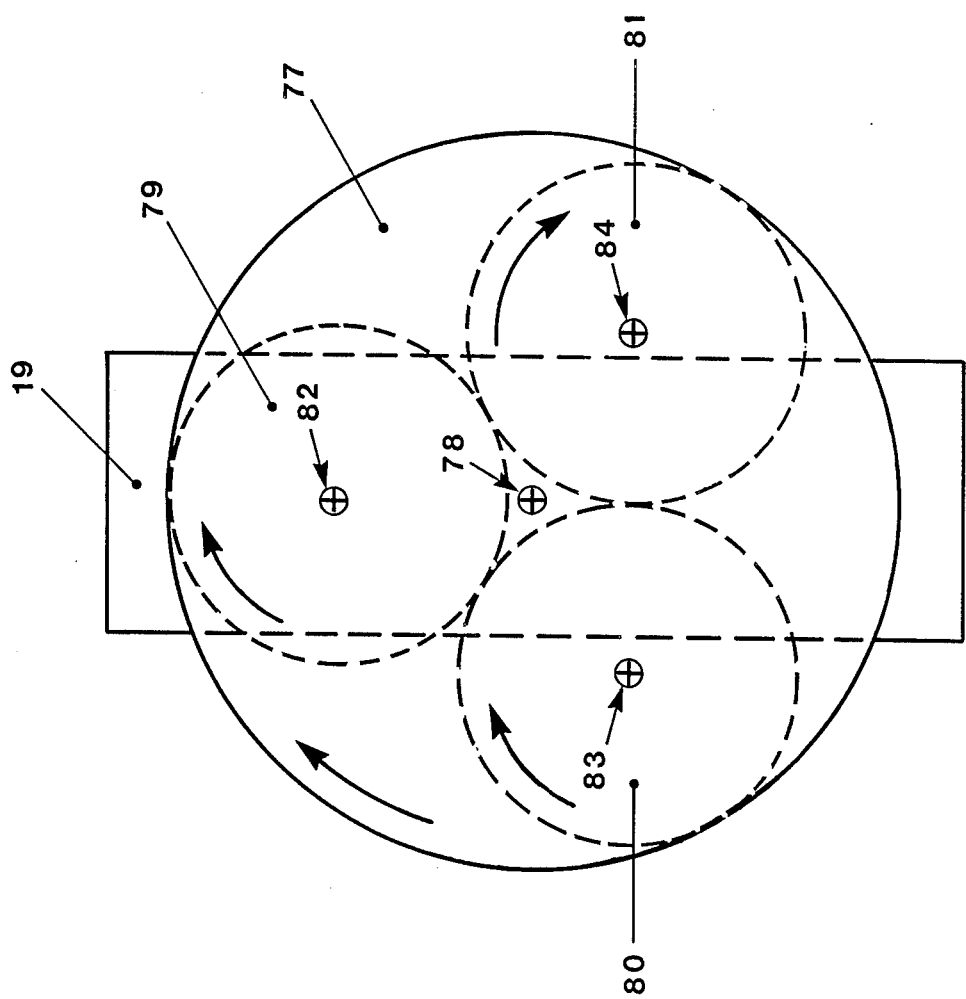
FIG. 6 is a further planetary motion embodiment including a plurality of substrate carriers.

A further embodiment of a planetary motion mechanism is illustrated in FIG. 6. As seen in FIG. 6, mounted on the carrier disc 77, which rotates about an axle 78, are substrate carrier discs 79, 80 and 81 which rotate, respectively, about axles 82, 83 and 84. Once again, substrates would be mounted on the side of the substrate carriers 79, 80 and 81 facing the microwave window 19. The rotary motion is imparted to discs 77, 79, 80 and 81 via motor, gear and/or chain drive arrangements as is well known in the art.

Although particular embodiments have been described, these were for the purpose of illustrating, but not limiting, the invention. Various modifications, which will come readily to the mind of one skilled in the art, are within the scope of the invention as defined in the appended claims.

I claim:

1. An apparatus for treating at least one substrate with a plasma, said apparatus including:
   means for producing said plasma along a first direction;
   said means for producing said plasma comprising a longitudinally extending microwave support structure having an input coupler at a first end thereof and a second end spaced from said first end, said first direction being the direction from said first end to said second end;
   a substrate carrier for carrying said at least one substrate;
   means for imparting rotational motion to said substrate carrier about an axis perpendicular to said direction and in a plane substantially parallel to said direction; and
   means for imparting rotational motion to said substrate carrier in said plane and in a direction perpendicular to said direction;
   said means for imparting rotational motion being functionally related to said means for imparting translational motion whereby said rotational motion and said translational motion are applied simultaneously to said substrate carrier;
   whereby, said at least one substrate will be substantially uniformly treated by said plasma.

2. An apparatus as defined in claim 1 wherein said substrate carrier and said means for imparting rotational and translational motion are disposed in a reaction chamber.

3. An apparatus as defined in claim 2 wherein said reaction chamber comprises a rear openable door;
   a microwave-transparent window disposed along the length of a front wall of said reaction chamber;
   and wherein said means for producing said plasma comprises a microwave slow wave structure disposed at an acute angle outside of said reaction chamber along said microwave window;
   the direction of said microwave window and said slow wave structure comprising said first direction.

4. An apparatus as defined in claim 3 wherein said substrate carrier is disc-shaped and having an axle extending at right angles to the center of said disc;
   said disc being rotated by rotation of said axle.

5. An apparatus as defined in claim 4 wherein said means for imparting both rotational and translational motion comprises at least one motor and means for transmitting the motion of said at least one motor to said substrate carrier.

6. An apparatus as defined in claim 5 wherein said means for transmitting comprises an arrangement of gears and/or chain drives.

7. An apparatus as defined in claim 6 and further including temperature control means for controlling the temperature of said substrate carrier.

8. A process for treating at least one substrate with a plasma, said process comprising:
   mounting said at least one substrate on a substrate carrier;
   producing said plasma along a first direction by a means for producing said plasma comprising a longitudinally extending microwave support structure having an input coupler at a first end thereof and a second end spaced from said first end, said first direction being the direction from said first end to said second end;
   rotating said substrate carrier in a plane substantially parallel to said direction; and
   simultaneously moving said substrate carrier in a translational manner in said plane and in a direction perpendicular to said direction;
   whereby, to substantially uniformly treat said at least one substrate by said plasma.

9. An process as defined in claim 8 and further including the step of controlling the temperature of said substrate carrier.

10. An apparatus for treating at least one substrate with a plasma, said apparatus including:
    means for producing said plasma along a first direction;
    said means for producing said plasma comprising a longitudinally extending microwave support structure having an input coupler at a first end thereof and a second end spaced from said first end, said first direction being the direction from said first end to said second end;
    a substrate carrier for carrying said at least one substrate;
    means for imparting motion to said substrate carrier simultaneously in two directions relative to said first direction;
    whereby said at least one substrate will be substantially uniformly treated by said plasma.

11. An apparatus as defined in claim 10 and further including temperature control means for controlling the temperature of said substrate carrier.

12. An apparatus for treating at least one substrate with a plasma, said apparatus including:

means for producing said plasma along a first direction;

said means for producing said plasma comprising a longitudinally extending microwave support structure having an input coupler at a first end thereof and a second and spaced from said first end, said first direction being the direction from said first end to said second end;

substrate carrier means for carrying said at least one substrate;

first means for imparting rotational motion about first axle means to said substrate carrier means in a plane substantially parallel to said direction; and second means for imparting rotational motion to said first axle means about a second axle;

said first means for imparting rotational motion being functionally related to said second means for imparting rotational motion whereby said first and second rotational motions are applied simultaneously to said substrate carrier;

whereby, said substrate exibits planetary motion relative to said first direction so that said at least one substrate will be substantially uniformly treated by said plasma.

13. An apparatus as defined in claim 12 wherein said substrate carrier means and said means for imparting rotational motion are disposed in a reaction chamber.

14. an apparatus as defined in claim 13 wherein said reaction chamber comprises a rear openable door;

a microwave-transparent window disposed along the length of the front wall of said reaction chamber;

and wherein said means for producing said plasma comprises a microwave slow wave structure disposed outside of said reaction chamber along said microwave window;

the direction of said microwave window and said slow wave structure comprising said first direction.

15. An apparatus as defined in claim 14 wherein said substrate carrier means comprises a single circular disc and wherein said first axle means extends at right angles to the center of said circular disc; and wherein said means for imparting rotational motion to said first axle means is a second circular disc and said second axle extending at right angles to the center of said second circular disc.

16. An apparatus as defined in claim 15 wherein said means for imparting said rotational motion comprises a motor and means for transmitting the motion of said motor to said substrate carrier.

17. An apparatus as defined in claim 16 and further including temperature control means for controlling the temperature of said substrate carrier.

18. A process for treating at least one substrate with a plasma, said process comprising:

mounting said at least one substrate on a substrate carrier;

producing said plasma along a first direction by a means for producing said plasma comprising a longitudinally extending microwave support structure having an input coupler at a first end thereof and a second end spaced from said first end, said first direction being the direction from said first end to said second end;

producing planetary motion of said substrate carrier relative to said direction and in a plane substantially parallel to said direction;

whereby to substantially uniformly treat said at least one substrate with said plasma.

19. A process as defined in claim 18 and further including the step of controlling the temperature of said substrate carrier.

20. A process for treating at least one substrate with a plasma, said process comprising:

mounting said at least one substrate on a substrate carrier;

producing said plasma along a first direction by a means for producing said plasma comprising a longitudinally extending microwave support structure having an input coupler at a first end thereof and a second end spaced from said first end, said first direction being the direction from said first end to said second end;

moving said substrate carrier simultaneously in two directions relative to said first direction;

whereby to substantially uniformly expose said at least one substrate to said plasma.

21. A process as defined in claim 20 and further including the step of controlling the temperature of said substrate carrier.

22. An apparatus as defined in claim 14 wherein said substrate carrier means comprises a plurality of circular discs, and wherein said first axle means comprises an axle for each of said circular discs, each axle extending at right angles to the center of its respective circular disc; and wherein said means for imparting rotational motion to said plurality of axles comprises a further circular disc and a further axle extending at right angles to the center of said further circular disc.

23. An apparatus as defined in claim 22 wherein said means for imparting said rotational motion comprises a motor and means for transmitting the motion of said motor to said substrate carrier.

24. An apparatus as defined in claim 23 and further including temperature control means for controlling the temperature of said substrate carrier.

25. An apparatus for treating at least one substrate with a plasma, said apparatus including:

means for producing said plasma along a first direction;

said means for producing said plasma comprising a longitudinally extending microwave support structure having an input coupler at a first end thereof and a second end spaced from said first end, said first direction being the direction from said first end to said second end;

a substrate carrier for carrying said at least one substrate;

means for providing relative motion, in a plane parallel to said first direction, between said micorwave applicator and said substrate carrier, said motion being compound motion consisting of at least two simultaneously acting components;

whereby, said at least one substrate will be substantially uniformly treated by said plasma.

26. An apparatus as defined in claim 25 wherein said at least two components comprise a rotational component and a translational component.

27. An apparatua as defined in claim 25 wherein said at least two components both comprise rotational components.

28. A process for treating at least one substrate with a plasma, said process comprising:

mounting said at least one substrate on a substrate carrier;

producing said plasma along a first direction by a means for producing plasma comprising a longitudinally extending microwave support structure having an input coupler at a first end thereof and a second end spaced from said first end, said first direction being the direction from said first end to said second end;

providing relative motion, at a plane parallel to said first direction, between said microwave applicator and said substrate carrier, said motion being compound motion consisting of at least two simultaneously acting components;

whereby, to substantially uniformly treat said at least one substrate by said plasma.

29. A process as defined in claim 28 wherein said at least two components comprise a rotational component and a translational component.

30. A process as defined in claim 28 wherein said at least two components both comprise rotational components.

* * * * *

UNITED STATES PATENT AND TRADEMARK OFFICE
CERTIFICATE OF CORRECTION

PATENT NO. :  4,728,863

DATED :  March 1, 1988

INVENTOR(S) :  Michael R. Wertheimer

It is certified that error appears in the above-identified patent and that said Letters Patent is hereby corrected as shown below:

Column 5, line 51, "forimparting" should read --for imparting--.

Column 5, line 55, "rotational" should read --translational--.

Column 8, line 53, "micorwave" should read --microwave--.

Column 8, line 62, "apparatua" should read --apparatus--.

Signed and Sealed this

Third Day of January, 1989

Attest:

Attesting Officer

DONALD J. QUIGG

Commissioner of Patents and Trademarks